(12) United States Patent
Chen et al.

(10) Patent No.: US 10,622,134 B2
(45) Date of Patent: Apr. 14, 2020

(54) METHOD AND SYSTEM FOR CONTROLLING COOLING SYSTEM OF POWER EQUIPMENT

(71) Applicant: ABB Schweiz AG, Baden (CH)

(72) Inventors: Yao Chen, Beijing (CN); Niya Chen, Beijing (CN); Rongrong Yu, Beijing (CN)

(73) Assignee: ABB Schweiz AG, Baden (CH)

( * ) Notice: Subject to any disclaimer, the term of this patent is extended or adjusted under 35 U.S.C. 154(b) by 43 days.

(21) Appl. No.: 16/000,571

(22) Filed: Jun. 5, 2018

(65) Prior Publication Data

US 2018/0286557 A1 Oct. 4, 2018

Related U.S. Application Data

(63) Continuation of application No. PCT/CN2016/073620, filed on Feb. 5, 2016.

(51) Int. Cl.
*G05D 23/00* (2006.01)
*H01F 27/08* (2006.01)
(Continued)

(52) U.S. Cl.
CPC .......... *H01F 27/085* (2013.01); *G05B 19/408* (2013.01); *H01F 27/008* (2013.01);
(Continued)

(58) Field of Classification Search
CPC ................................ H01F 27/33; G06Q 50/06
(Continued)

(56) References Cited

U.S. PATENT DOCUMENTS 9,002,532 B2* 4/2015 Asmus ............... G05D 23/1917
700/300
2008/0294297 A1 11/2008 Bretzner et al.
(Continued)

FOREIGN PATENT DOCUMENTS

CN 202205070 U 4/2012
CN 102890520 A 1/2013
(Continued)

OTHER PUBLICATIONS

Chinese Office Action, Chinese Patent Application No. 201680071111. 9, dated Feb. 3, 2019, 6 pages including machine translation in English.
(Continued)

*Primary Examiner* — Md Azad
(74) *Attorney, Agent, or Firm* — Taft Stettinius & Hollister LLP; J. Bruce Schelkopf

(57) ABSTRACT

A method for controlling cooling system of a power equipment and a system using the same. The method includes steps of: obtaining a first data set representing operational cost related parameters specific to the power equipment and its cooling system at a series of time intervals of a first load cycle in a history profile; obtaining a second data set representing operational cost related parameters specific to the power equipment and its cooling system at a series of time intervals of a second load cycle in the history profile, establishing a third data set, establishing a fourth data set; establishing a fifth data set; establishing a sixth data set; and controlling the cooling system to operate at a series of time intervals of the present load cycle at the stablished cooling capacity parameters concerning the present load cycle represented by the sixth data set.

20 Claims, 4 Drawing Sheets

(51) Int. Cl.
*G05B 19/408* (2006.01)
*H01F 27/00* (2006.01)
*H01F 27/33* (2006.01)
*H05K 7/20* (2006.01)
*G06Q 50/06* (2012.01)

(52) U.S. Cl.
CPC ......... *H01F 27/33* (2013.01); *H05K 7/20209* (2013.01); *G06Q 50/06* (2013.01)

(58) Field of Classification Search
USPC .......................................................... 70/300
See application file for complete search history.

(56) References Cited

U.S. PATENT DOCUMENTS

| | | | | |
|---|---|---|---|---|
| 2010/0312415 | A1* | 12/2010 | Loucks | G06F 1/206 700/300 |
| 2011/0218694 | A1* | 9/2011 | Moriya | H01M 10/42 700/300 |
| 2015/0088576 | A1* | 3/2015 | Steven | G06Q 50/06 705/7.22 |
| 2015/0131186 | A1* | 5/2015 | Tonin | H01H 35/40 361/38 |

FOREIGN PATENT DOCUMENTS

| | | |
|---|---|---|
| CN | 103324130 A | 9/2013 |
| CN | 103778575 A | 5/2014 |
| GB | 2473543 A | 3/2011 |
| WO | 2011021185 A1 | 2/2011 |
| WO | 2015058354 A1 | 4/2015 |
| WO | 2017088172 A1 | 6/2017 |

OTHER PUBLICATIONS

Chinese Search Report, Chinese Patent Application No. 201680071111.9, dated Feb. 3, 2019, 4 pages including machine translation in English.
Intellectual Property Office of the P.R. China, International Search Report & Written Opinion issued in corresponding Application No. PCT/CN2016/073620, dated Jun. 16, 2016, 9 pp.
European Patent Office, Extended European Search Report issued in corresponding European application No. 16888806, dated Nov. 4, 2019, 8 pp.

* cited by examiner

METHOD AND SYSTEM FOR CONTROLLING COOLING SYSTEM OF POWER EQUIPMENT

TECHNICAL FIELD

The invention relates to control of temperature of a power equipment, and more particularly to control of temperature of a power equipment with digital data processing.

BACKGROUND ART

Power equipment, for example, can be power transformer, machine and so on, whose losses vary with its loading level, and substantial part of its losses is converted into heat. Due to higher power ratings, power equipment is often cooled by forced-air cooling, forced-oil cooling, water-cooling, or combinations of these. Therefore, the power equipment needs a cooling system which, for example, can be an arrangement of at least one fan or blower pumping cooling-air or liquid coolants as oil and water. The practice of slowing down or speeding up cooling system to keep temperature of a power equipment within a predetermined range is common and there are numerous technologies that accomplish this.

An operation efficiency of the power equipment is influenced by several parameters, such as the costs related to power lose, life lose and noise-reduction. To optimize the power equipment operation efficiency as an objective for optimization-based design, these parameters have to be adjusted with conflicting constraints. For example, normally, lower winding temperature leads to the lower copper loss of winding. However, the power consumption of the cooling system will be higher at the same time, meaning that the overall efficiency, considering both power equipment winding and the cooling system itself, might be less optimal. Besides efficiency, the variation of the winding temperature is also one key factor which will affect the lifecycle of the power equipment. The more frequent the temperature varies, the faster the power equipment aging will be. It could be so that the efficiency of the power equipment is optimized, however at a cost of shortened lifetime. For a power equipment operated at urban area, noise level is also one important criterion to consider in order to reduce the impact on the neighbouring residents especially at night.

A variable speed cooling system controller has been developed that is intended for optimization of the operation efficiency of power transformer. One example is described in Pat. WO 2015/058354, wherein the concept of objective optimization considering the constraints of its power loss, life loss and noise for transformer cooling control has been disclosed. The solution involves preprocessing the initial data input by user; collecting the on-line data, and based on a quantitative model according to criteria specified for a time interval, calculating the optimized control command to meet the requirement of the transformer loss, top-oil temperature variation and noise; and executing the control actions by controlling a controllable switch and/or sending a control command to a variable frequency driver activating the cooling system. Such solution enables improving operation efficiency of the transformer by cooling control considering transformer copper loss, motor-fans power consumption and speed regulation of variable frequency drive. With this approach, a computer is used to search for the best cooling control realizing speed regulation for the motor-fan loads selectively with low capital investment on variable frequency drive in an efficient manner.

According to the quantitative model described in Pat. WO 2015/058354, the objective of its criteria to be optimized concerns with the power transformer operation efficiency in a certain time interval of a multiple continuous time intervals consisting of a load cycle. The load cycle can be a period of time, where the loading level of the power equipment appears in a substantially cyclic manner, for example 24 hours. The load cycle can be divided into several time units either with equal length or unequal, for example 24 time intervals each lasting for one hour. This quantitative model only predicts the power transformer operation efficiency respectively in terms of each of the time intervals. However, because the response of interest for previous time intervals will have effect upon the subsequent, separate optimization design based on the quantitative model might not suffice for optimal criteria for an operation efficiency objective concerning a load cycle of a power equipment. For example, the cooling optimization at time interval n might lead to higher initial temperature for time interval n+1. Such temperature difference will accumulate step-by-step for the computation of the response of interest concerning the time intervals of the load cycle subsequent to the initial time interval n, which will gradually increase transformer power loss and life loss. Therefore, even if the optimization algorithm in terms of each of the time intervals can achieve the best result at every time internal, not necessarily the best for an entire load cycle.

BRIEF SUMMARY OF THE INVENTION

It is therefore an objective of the invention to provide a method for controlling cooling system of a power equipment, including steps of: obtaining a first data set representing operational cost related parameters specific to the power equipment and its cooling system at a series of time intervals of a first load cycle in a history profile; obtaining a second data set representing operational cost related parameters specific to the power equipment and its cooling system at a series of time intervals of a second load cycle in the history profile, where the second load cycle follows the first load cycle; in consideration of the parameters represented by the first data set, through knowledge-based predetermined numerical and/or logical linkages, establishing a third data set representing optimal cooling capacity parameters for the cooling system at the series of time intervals of the first load cycle according to criteria for operational cost optimization of the power equipment; in consideration of the parameters represented by the second data set, through knowledge-based predetermined numerical and/or logical linkages, establishing a fourth data set representing optimal cooling capacity parameters for the cooling system at the series of time intervals of the second load cycle according to criteria for operational cost optimization of the power equipment; establishing a fifth data set representing a cooling capacity parameter difference between the established cooling capacity parameters concerning the first load cycle and the second load cycle; establishing a sixth data set representing cooling capacity parameters for the cooling system at a series of time intervals of a present load cycle by computationally correcting the established cooling capacity parameter concerning the time intervals of the second cycle load with use of the cooling capacity parameter difference; and controlling the cooling system to operate at a series of time intervals of the present load cycle at the established cooling capacity parameters concerning the present load cycle represented by the sixth data set. An overall resulting optimal cooling capacity parameters for a series of time intervals of present load cycle is produced by linking the optimal cooling capacity parameters for its previous load cycle and the difference between the optimal cooling capacity parameters of its previous load cycle and the one before the previous. This allows exploration of the easily available historical data and statistical information about these historical data, so that precise and intelligent measure plans in regard to the cooling system of the power equipment may be prepared.

Preferably, more weight is put on the cooling capacity parameter difference in the computational correction related to the cooling capacity parameter at a first time interval than that at a second time interval of the present load cycle, where the first time interval is earlier than the second time interval. By applying various weights, it makes the prediction of cooling capacity for present load cycle more accurate in consideration that the similarity between the optimal cooling capacity at the last time interval of previous load cycle and that at respective time interval of present load cycle fades with the progress of the time intervals of the present load cycle.

Preferably, the cooling capacity parameter difference is calculated using the established cooling capacity parameter concerning a last time interval of the second load cycle and using a last time interval of the first load cycle. According to the history profile, there are three characteristics in comparing different load cycles: 1. Similarity; 2. Difference; 3. Continuity. The shape of two successive load cycles are very similar to each other, especially in the middle part. Meanwhile, the specific value at the beginning and end of two cycles are quite different from each other. Good thing is that continuity can be used to mitigate this difference. Therefore, it is possible use the similarity to build the whole curve shape for the present load cycle, and the difference and continuity to determine the specific value. The final value of the present load cycle is the balance between these two characteristics.

Preferably, the series of the time intervals of the present load cycle are defined to partially occupy a range of the present load cycle where the operational condition related parameters at their counterparts in the history profile are within a predetermined range; and the rest of the series of the time intervals of the present load cycle are defined wherein the operational condition related parameters at their counterparts in the history profile are outside of the predetermined range; the method further includes steps of: establishing a seventh data set representing cooling capacity parameters for the cooling system at the rest of the series of time intervals of the present load cycle using an information of the operational condition related parameters and using a value of an coefficient; and controlling the cooling system to operate at the rest of the series of time intervals of the present load cycle at the established cooling capacity parameters represented by the seventh data set. This allows to use the historical optimal cooling capacities and correlation function between the loading level and the optimal cooling capacity to predict optimal cooling capacity parameters for time interval of the present load cycle. This makes it possible to obtain a simple equation to represent the relationship between loading level and the optimal cooling capacity for time intervals of present load cycle. Therefore, its computation time for optimization can reduced.

Preferably, the method further includes steps of obtaining the first data set in consideration of operational condition related parameters for the power equipment for a series of time intervals of the first load cycle; and obtaining the second data set in consideration of operational condition related parameters for the power equipment for a series of time intervals of the second load cycle.

According to another aspect of present invention, it provides a method for controlling cooling system of a power equipment, including steps of: obtaining a eighth data set representing operational condition related parameters for the power equipment at a first series of time intervals of a plurality of load cycles in a history profile; obtaining a ninth data set representing operational condition related parameters for the power equipment at a second series of time intervals preceding present time interval of a present load cycle in the history profile; determining a third series among the first series of time intervals where the operational condition related parameters at the third series of time intervals are most close to those at the second series of time intervals; obtaining a tenth data set representing operational cost related parameters specific to the power equipment and its cooling system for a third of the plurality of load cycle occupying the third series of time intervals; in consideration of the parameters represented by the tenth data set, through knowledge-based predetermined numerical and/or logical linkages, establishing a eleventh data set representing cooling capacity parameters for the cooling system at the series of time intervals of the third load cycle according to criteria for operational cost optimization of the power equipment and its cooling system; and at the present time interval of the present load cycle, controlling the cooling system to operate at the cooling capacity parameter established for the time interval following the third series of the time interval of the third load cycle. This method allows to use historical optimal cooling capacities, the correlation functions between the loading level and the optimal cooling capacity, and the data pattern of the loading ratio and ambient temperature to predict the optimal cooling capacity parameter for a series of time intervals of the present load cycle. The working principle is the use of pattern recognition to find an operational condition related parameters at m time intervals prior to present time interval n in the historical data set which has the closest distance to the operational condition related parameters at the previous time interval n-m. When the closest historical vector is identified, then the optimal cooling capacity parameter at time interval n−m+1 will be determined as the optimal cooling capacity parameter for the present time interval n.

Preferably, the operational cost related parameters specific to the power equipment and its cooling system are concerned with power loss of them, the power equipment lifecycle cost and noise reduction cost for the cooling system; and the operational condition related parameter for the power equipment is concerned with ambient temperature and loading level.

According to another aspect of present invention, it provides a system for controlling cooling system of a power equipment, which has at least one data processing device, wherein the data processing device is configured for executing the method above.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods and programming procedures, devices, and circuits are omitted so not to obscure the description of the present invention with unnecessary detail.

Figure 1:
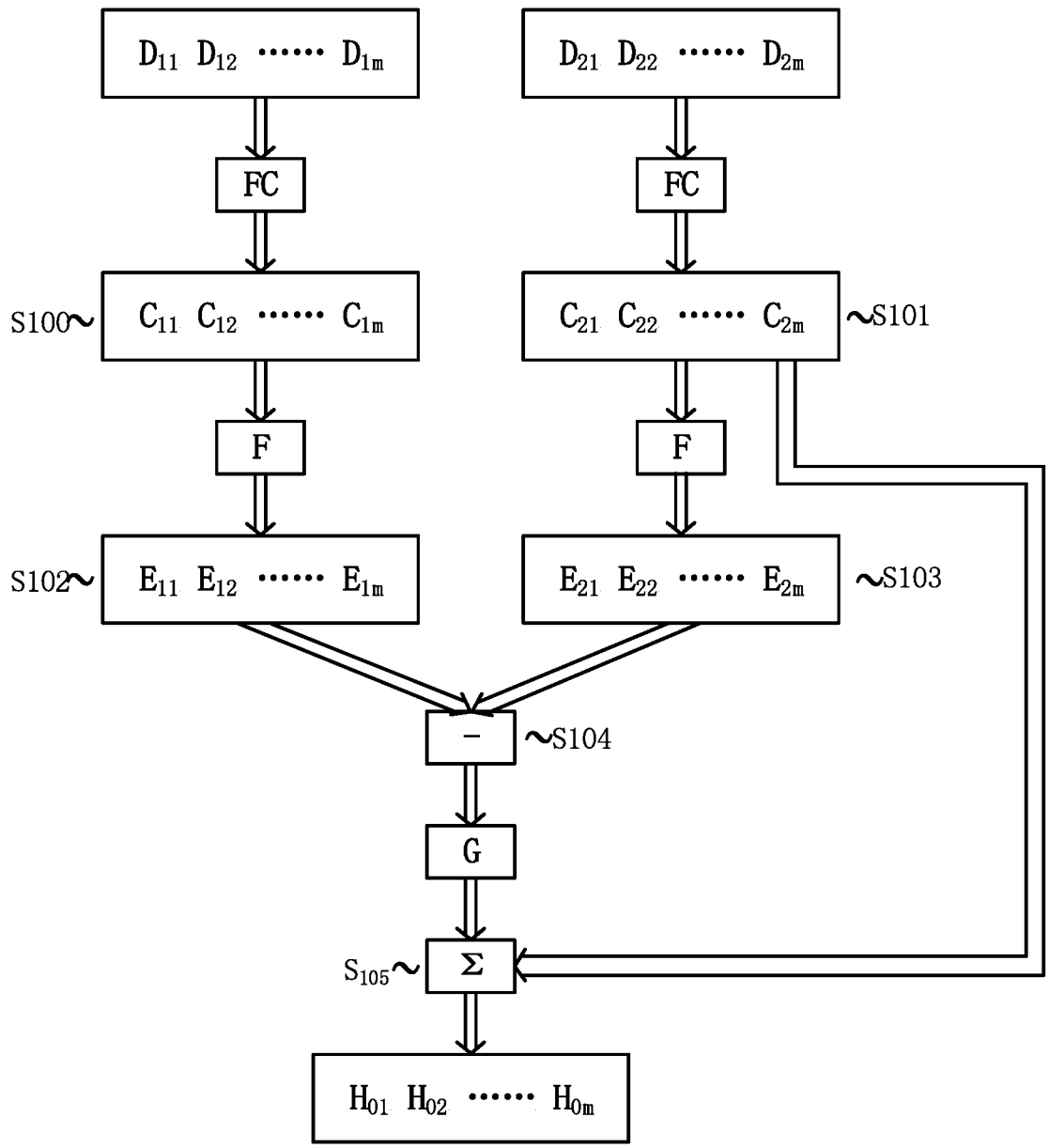
FIG. 1 illustrates a method for controlling cooling system of a power equipment according to an embodiment of present invention.
Figure 2:
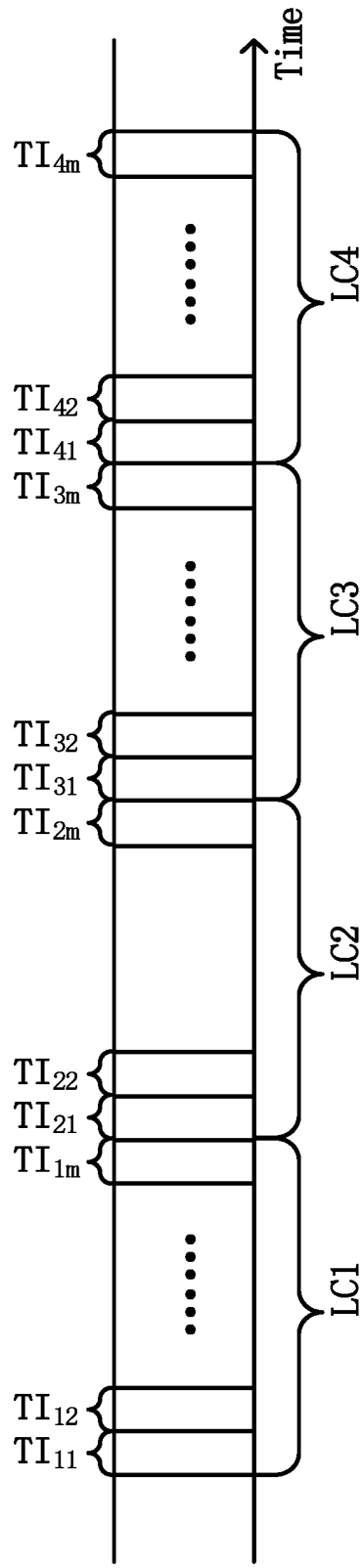
FIG. 2 is a diagram showing a schedule of load cycle and its time intervals according to an embodiment of present invention.

FIG. 1 illustrates a method for controlling cooling system of a power equipment according to an embodiment of present invention. For example, the power equipment is a power transformer. As shown in FIG. 1, operational cost related parameters Powerloss, Lifeloss, Noisereductionloss respectively for a first load cycle and a second load cycle in the history are determined step-by-step. The operational cost related parameter Powerloss, Lifeloss, Noisereductionloss is relating to economic significance of the power equipment and its cooling. FIG. 2 is a diagram showing a schedule of load cycle and its time intervals according to an embodiment of present invention. FIG. 2 sees a sequence of load cycles arranged along the time axis, $LC_1$, $LC_2$, $LC_3$, $LC_4$. The load cycle can be a period of time, where the loading level of the power equipment appears in a substantially cyclic manner, for example 24 hours. The load cycle can be divided into several time intervals either with equal length or unequal, for example 24 time intervals each lasting for one hour. As shown in FIG. 2, each of the load cycles $LC_1$, $LC_2$, $LC_3$, $LC_4$ consists of a series of time intervals, for example load cycle $LC_1$ includes a series of time intervals $TI_{11}$, $TI_{12}$ ... $TI_{1m}$, load cycle $LC_2$ includes a series of time intervals $TI_{21}$, $TI_{22}$ .... $TI_{2m}$, load cycle $LC_3$ includes a series of time intervals $TI_{31}$, $TI_{32}$ ... $TI_{3m}$, load cycle $LC_4$ includes a series of time intervals $TI_{41}$, $TI_{42}$ ... $TI_{4m}$. A load cycle arrives later than whichever is schedule to its left on the time axis, for example $LC_2$ is later than $LC_1$ and $LC_4$ is later than $LC_3$. Assuming present load cycle is indicated by $LC_4$, the first load cycle and the second load cycle in the history can be any two of the load cycles $LC_1$, $LC_2$, $LC_3$, where the second load cycle is later than the first load cycle, for example, $LC_2$ indicates the first load cycle and $LC_3$ indicates the second load cycle. Preferably, the present load cycle directly follows the second load cycle, and the second load cycle directly follows the first load cycle.

To determine the operational cost related parameters Powerloss, Lifeloss, NoiseReductionLoss which describes economic significance of the power equipment and its cooling, such as estimations of power loss of the power equipment, the power equipment lifecycle cost and noise reduction cost for the cooling system, in step S100, at least a first data set representing operational cost related parameters Powerloss, Lifeloss, NoiseReductionLoss $C_{11}$, $C_{12}$, ... $C_{1m}$ at a series of time intervals of a first load cycle in a history profile is determined. In step S101, at least a second data set representing operational cost related parameters Powerloss, Lifeloss, NoiseReductionLoss $C_{21}$, $C_{22}$, ... $C_{2m}$ at a series of time intervals of a second load cycle in a history profile is determined, where the second load cycle follows the first load cycle. The input data for the operational cost related parameters $C_{11}$, $C_{12}$, ... $C_{1m}$, $C_{21}$, $C_{22}$, ... $C_{2m}$ may be determined on their counterparts already stored in a history profile, or as an alternative, be estimated based on operational condition related parameter AmbientTemperature, LoadingLevel respectively for the first load cycle and the second load cycle in a history profile using an upstream preliminary stage processing FC. The operational condition related parameter AmbientTemperature, LoadingLevel is relating to technical status of the power equipment, in particular the operational condition related parameters AmbientTemperature, LoadingLevel $D_{11}$, $D_{12}$, ... $D_{1m}$ at the series of time intervals of the first load cycle in a history profile, and the operational condition related parameters AmbientTemperature, LoadingLevel $D_{21}$, $D_{22}$, ... $D_{2m}$ at the series of time intervals of the second load cycle in a history profile. These values are then introduced into the method and/or transferred to the system as technical input data, if necessary using appropriately pre-configured interfaces for data detection and/or transmission, for example, via a local area network (LAN) and/or a world area network (WAN), particularly the Internet or a radio network, or as accessible on a data storage, preferably in a database or stored data set.

Further in step S102, an optimal cooling capacity parameters CoolingCapacityParameter $E_{11}$, $E_{12}$, ... $E_{1m}$ for at the series of time intervals of the first load cycle may generally be produced in this case from numerical values $C_{11}$, $C_{12}$, ... $C_{1m}$ relating, for example, to power loss and life loss occurring in the power equipment at the series of time intervals of the first load cycle, through at least one numerical and/or logical linage rule of the general formula $F(C_{11}, C_{12}, ... C_{1m})$, and in step S103, an optimal cooling capacity parameters CoolingCapacityParameter $E_{21}$, $E_{22}$, $E_{2m}$ for at the series of time intervals of the second load cycle may generally be produced in this case from numerical values $C_{21}$, $C_{22}$, ... $C_{2m}$ relating, for example, to power loss and life loss occurring in the power equipment at the series of time intervals of the first load cycle, through at least the one numerical and/or logical linage rule of the general formula $F(C_{21}, C_{22}, ... C_{2m})$. The formula F may be an objective function, and based on that it is possible to search the design space of cooling capacity parameters at the first load cycle and/or the second load cycle. The design variables are adjusted by the algorithm in order to achieve objective of optimal operation cost for the first load cycle and/or the second load cycle. This will be described thereafter in section I. For this purpose, in consideration of the first data set representing the operational cost related parameters Powerloss, Lifeloss, NoiseReductionLoss for the first load cycle, through knowledge-based predetermined numerical and/or logical linkages, it is established a third data set representing cooling capacity parameters CoolingCapacityParameter for the cooling system at the series of time intervals of the first load cycle according to criteria for operational cost optimization of the power equipment. Similarly, in consideration of the second data set representing the operational cost related parameters Powerloss, Lifeloss, NoiseReductionLoss for the second load cycle, through knowledge-based predetermined numerical and/or logical linkages, it is established a fourth data set representing cooling capacity parameters CoolingCapacityParameter for the cooling system at the series of time intervals of the second load cycle according to criteria for operational cost optimization of the power equipment.

Input data of the operational condition related parameters AmbientTemperature, LoadingLevel required for determining estimation of top-oil/hot-spot temperature of the power equipment which is further considered for estimation of the operational cost related parameters Powerloss, Lifeloss, NoiseReductionLoss for the first load cycle and the second load cycle, may be estimated based on historical profile derived from professional knowledge and/or experience. The obtaining step may be performed automatically in combination with appropriately configured database and/or manually input by an operator, or by receiving data representing the ambient temperature. For example, the operational condition related parameters represented by the second/third data set are output values of a processing of those in history profile, and the history profile covers load cycles before the present.

On-line or off-line generation of the different input variables and/or input parameters by an operator is also possible.

Figure 3:
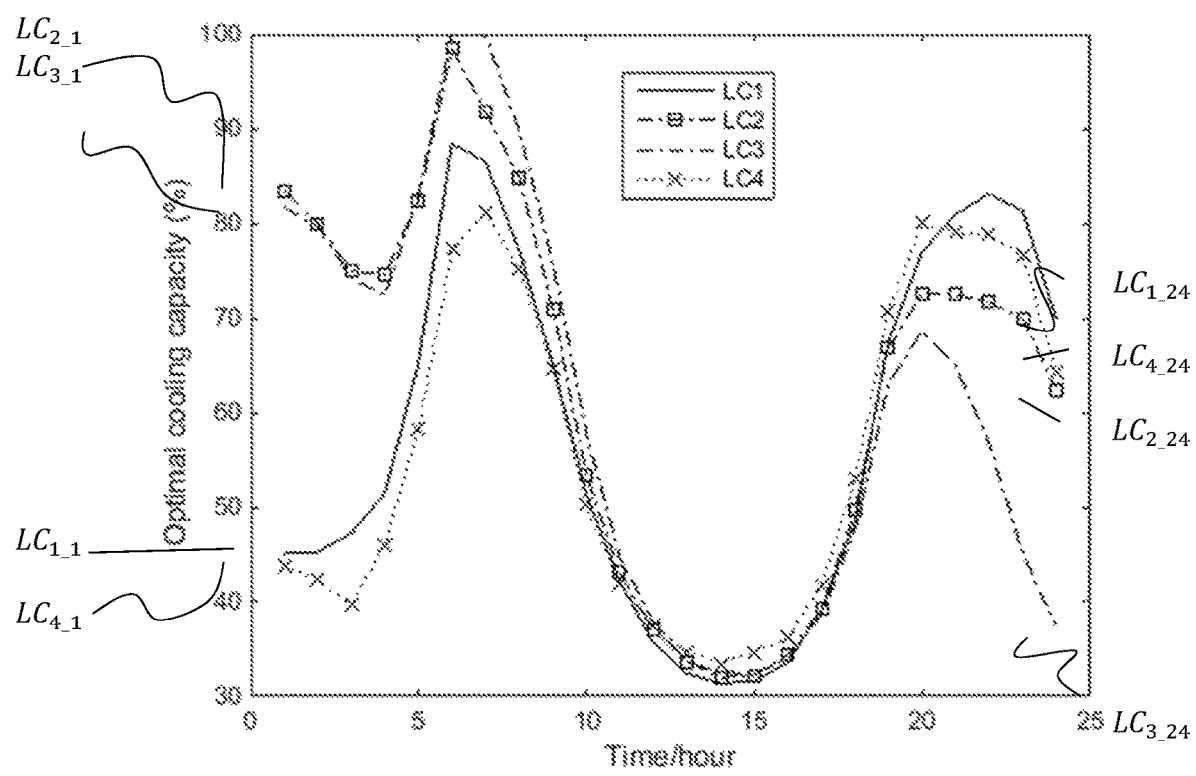
FIG. 3 shows plots of optimal cooling capacity parameters for load cycles.

Plots of optimal cooling capacity parameters for load cycles are illustrated by FIG. 3, where the load cycles $LC_1$, $LC_2$, $LC_3$, $LC_4$ arrived in sequence in the history. As shown in FIG. 3, load cycle is exemplified as a day (24 hours), and the time interval is exemplified as hour (1, 2 ... 24). The optimal cooling capacity parameter for the starting time interval of the load cycle $LC_4$ has been found to be associated with that for the last time interval of its preceding load cycle $LC_3$, and has been found to be disassociated with that for the starting time interval of its preceding load cycle $LC_3$. This holds true for any two successive load cycles, such as load cycles $LC_3$ and $LC_2$, load cycles $LC_2$ and $LC_1$. In other words, the starting time interval cooling capacity parameters of a load cycle is more affected by the last time interval cooling capacity parameters of its preceding load cycle instead of the starting time interval. Besides, it can be observed from the plots in FIG. 3 that the optimal cooling capacity parameters for a series of time intervals of load cycle $LC_4$ subsequent to the load cycle $LC_3$ has association with both of the optimal cooling capacity parameters concerning the time intervals of the load cycle $LC_3$ and difference between the optimal cooling capacity parameters concerning the load cycle $LC_3$ and its previous $LC_2$; and this holds true for another three successive load cycles $LC_3$, $LC_2$ and $LC_1$. In short, there are three characteristics in comparing different cycles: 1. Similarity; 2. Difference; 3. Continuity. The shape of two successive load cycles are very similar to each other, especially in the middle part. Meanwhile, the specific value at the beginning and end of two cycles are quite different from each other. Good thing is that continuity can be used to mitigate this difference: $LC_{4\_1}$ is close to $LC_{3\_24}$, $LC_{3\_1}$ is close to $LC_{2\_24}$, $LC_{2\_1}$ is close to $LC_{1\_24}$ and this explains the observation that: $LC_{2\_24}$ is smaller than $LC_{1\_24}$, and $LC_{3\_1}$ is smaller than $LC_{2\_1}$; $LC_{3\_24}$ is much smaller than $LC_{2\_24}$, then $LC_{4\_1}$ is much smaller than $LC_{3\_1}$. Therefore, it is possible use the similarity to build the whole curve shape for the present load cycle, and the difference and continuity to determine the specific value (curve position in y axis). The final value of the present load cycle is the balance between these two characteristics.

By employing the correlation, an overall resulting optimal cooling capacity parameters for a series of time intervals of present load cycle is produced by linking the optimal cooling capacity parameters for its previous load cycle and the difference between the optimal cooling capacity parameters of its previous load cycle and the one before the previous. For example, if a fresh load cycle $LC_5$ (not shown) is taken as the present load cycle subsequent to load cycle $LC_4$, the optimal cooling capacity parameters at the time intervals of the present load cycle $LC_5$ are established in consideration of those for its previous load cycle $LC_4$ and the difference of the optimal cooling capacity parameters concerning the previous load cycle $LC_4$ and those of the one before the previous $LC_3$. This allows exploration of the easily available historical data and statistical information about these historical data, so that precise and intelligent measure plans in regard to the cooling system of the power equipment may be prepared.

Consequently, the cooling system of the power equipment is controlled to operate at a series of time intervals of the present load cycle at the established cooling capacity parameters concerning the present load cycle. Since the optimal cooling capacity parameters concerning the present load cycle are determined with their correlation to the optimal cooling capacity parameters of its previous load cycle and the optimal cooling capacity parameter difference between its previous load cycle and that before the previous, and such correlation has been proved by a greater number of cases in the history profile, the operation of the cooling system of the power equipment is optimized. For this purpose, further in step S104, a fifth data set is established representing a cooling capacity parameter difference G between the established cooling capacity parameters concerning the first load cycle and the second load cycle $E_{11}$, $E_{12}$, ... $E_{1m}$, $E_{21}$, $E_{22}$, ... $E_{2m}$, and in step of S105, a sixth data set is established representing cooling capacity parameters $H_{01}$, $H_{02}$, ... $H_{0m}$ for the cooling system at a series of time intervals of a present load cycle by computationally correcting the established cooling capacity parameter concerning the time intervals of the second cycle load with use of the cooling capacity parameter difference, which will described thereafter in section II. Consequently, the cooling system is controlled to operate at a series of time intervals of the present load cycle at the established cooling capacity parameters concerning the present load cycle represented by the sixth data set.

Section I
Objective Function Calculation

The optimization objectives include: power loss of both transformer and cooling system, lifetime loss of transformer, and noise emission from cooling fans, as expressed by the following equations, where n represents the time internal for cooling optimization.

$$\begin{cases} f1(n) = \text{Powerloss\_TX}(n) + \text{Powerloss\_CO}(n) \\ f2(n) = \text{Lifeloss\_TX}(n) \\ f3(n) = \text{Noise\_CO}(n) \end{cases} \quad (1)$$

TX is transformer-related, and CO is cooling-system-related.

These three objectives can all be regarded as a function of cooling capacity that put into operation.

In order to unify these three objectives into one, other three parameters should be introduced as: electricity price, transformer lifecycle cost, and noise reduction cost. Therefore these three factors can be turned into money and thus be unified together, as shown in the equation below.

$$f(n)=$$
$$f1(n) \times \text{power loss cost}+$$
$$f2(n) \times \text{transformer lifeloss cost}+$$
$$f3(n) \times \text{noise reduction cost} \quad (2)$$

In order to realize the operational cost reduction during the whole load cycle, the objective function should be designed as shown in below, where F(n) is the final optimization target, which is the summation of the operational cost during a whole load cycle, i.e. 24 hours.

$$\text{Obj Func}=\min(F(n))$$
$$F(n)=f(n)+f(n+1)+\ldots+f(n+N), N=24 \quad (3)$$

In the present load cycle, the cooling system is controlled to operate at the cooling capacity parameters CoolingCapacityParameter at the series of time intervals.

The load cycle-oriented and systematically structured procedure according to the method is performed in this case, using a computer automatically searching for the best design according to criteria that is specified as above. This allows to achieve the minimum operational cost for power transformer during an entire load cycle by a compromise of several conflicting constraints as:

Energy efficiency improvement of the entire transformer system
Lifetime extension and reduced maintenance of transformer
Cooling system noise reduction.

Power Loss, Lifecycle Loss and Noise Level Determination

The determination of the data set representing the operational cost related parameters Powerloss, Lifeloss, NoiseReductionloss may be performed in this case, for example, by the calculation as below. Transformer copper loss will be a function of cooling capacity because the winding resistance will be different at different winding temperature. As expressed in equation (4), the copper loss $P_{TR}$ can be calculated by using the rated load loss $P_{TRN}$, the load factor K, the temperature coefficient of resistance of winding $\alpha$ (for copper winding, $\alpha=0.00393$), and the average winding temperature $\overline{\theta_w}$.

$$P_{TR}(n) = K(n)^2 \frac{1+\alpha\overline{\theta_w}(n)}{1+75\alpha} P_{TRN} \quad (4)$$

The power loss of cooling system can be represented by equation (5), where $P_{CON}$ is the rated power of motor-fan for cooling. With variable frequency drives, the power consumption will be cubic to the air flow out of cooling fans; without variable frequency drives, the power consumption will be proportional to the number of motor-fans that are put into operation.

$$\begin{cases} P_{CO}(n) = X(n) \times P_{CON}, & \text{without } VFD \\ P_{CO}(n) = X^3(n) \times P_{CON}, & \text{with } VFD \end{cases} \quad (5)$$

The life loss of transformer can be calculated by using the aging rate which is a function of top-oil/hot-spot temperature and the types of insulation paper, as shown in equation (6)

$$V(n) = \begin{cases} 2^{(\theta_h(n)-98)/6} \\ e^{\left(\frac{15000}{110+273} - \frac{15000}{\theta_h(n)+273}\right)} \end{cases} \quad (6)$$

Total noise from transformer $TRN_{ctrl}$ system can be calculated by using equation (7), where $TRN_1$ is the noise from transformer at ONAN condition, $CFN_{ctrl}$ is the noise from the cooling fans which are controlled by the optimal cooling strategy.

$$TRN_{ctrl}(n) = \quad (7)$$
$$\begin{cases} TRN_1 + 101 \text{ lg}\left(1+10^{-\frac{TRN_1-CFN_{ctrl}(n)}{10}}\right), & TRN_1 > CFN_{ctrl}(n) \\ CFN_{ctrl}(n) + 101 \text{ lg}\left(1+10^{-\frac{CFN_{ctrl}(n)-TRN_1}{10}}\right), & CFN_{ctrl}(n) \geq TRN_1 \end{cases}$$

Assume the noise from transformer at ONAF condition when all the cooling fans are in operation is $TRN_2$, the total number of motor-fan branches is $\text{num}_{fan}$, and X is the cooling capacity put into operation, then $CFN_{ctrl}$ can be calculated as below if no VFD is installed:

$$\begin{cases} CFN_{ctrl}(n) = CFN - 101 \text{ lg}(\text{num}_{fan}) + 101 \text{ lg}\left(\frac{X(n) \times \text{num}_{fan}}{100}\right) \quad (8) \\ CFN = TRN_2 - 101 \text{ lg}\left(1 + \frac{1}{10^{\frac{\alpha}{10}}-1}\right), \alpha = TRN_2 - TRN_1 \end{cases}$$

If VFD is installed, $CFN'_{ctrl}$ can be calculated by using (9)

$$CFN'_{ctrl}(n) = CFN + 50 \text{ lg}(X(n)/100) \quad (9)$$

In the equation (6), variables involve top-oil/hot-spot temperature which can be determined based on the principle as below.

Top-Oil/Hot-Spot Temperature Calculation

Top-oil/hot-spot temperature can be calculated by using the thermal models defined by IEC or IEEE. For example, according to IEC standard, the top-oil temperature $\theta_o$ can be obtained by calculating the incremental top-oil temperature $D\theta_o$ during time internal Dt as shown in Equation (10)

$$\begin{cases} D\theta_o(m) = \frac{Dt}{k_{11}\tau_o}\left[\left(\frac{1+R \times K_c(m)^2}{1+R}\right)^x \times \Delta\theta_{or} - (\theta_o(m-1) - \theta_a(m))\right] \quad (10) \\ \theta_o(m) = \theta_o(m-1) + D\theta_o(m) \end{cases}$$

where:
R is the ratio of load losses at rated current to no load losses;
$K_c$ is the corrected loading level
$\Delta\theta_{or}$ is the top-oil temperature rise in steady state at rated losses (no load losses+load losses)
$\theta_a$ is the ambient temperature
$k_{11}$ is the thermal model constant
$\tau_o$ is the average oil time constant
x is the exponential power of total losses versus top-oil temperature rise (oil exponent)

m is number of the time interval for temperature calculation

And the hot-spot temperature can be further calculated by using equation (11).

$$\begin{cases} D\Delta\theta_{h1}(m) = \dfrac{Dt}{k_{22}\tau_w}[k_{21}\times\Delta\theta_{hr}K(m)^y - \Delta\theta_{h1}(m-1)] \\ D\Delta\theta_{h2}(m) = \dfrac{Dt}{(1/k_{22})\tau_o}[(k_{21}-1)\times\Delta\theta_{hr}K(m)^y - \Delta\theta_{h2}(m-1)] \\ \Delta\theta_h(m) = \Delta\theta_{h1}(m-1) + D\Delta\theta_{h1}(m) - \Delta\theta_{h2}(m-1) - D\Delta\theta_{h2}(m) \\ \theta_h(m) = \theta_o(m) + \Delta\theta_h(m) \end{cases} \quad (11)$$

where:

$\Delta\theta_{hr}$ is the hot-spot to top-oil gradient at rated current $k_{21}/k_{22}$ is the thermal model constant $\tau_w$ is the winding time constant y is the exponential power of current versus winding temperature rise (winding exponent)

$\Delta\theta_{h1}$ and $\Delta\theta_{h2}$ are two interim variables to calculate the hot-spot temperature rise $D\Delta\theta_{h1}$ and $D\Delta\theta_{h2}$ are the incremental change of $\Delta\theta_{h1}$ and $\Delta\theta_{h2}$ during time period Dt It should be noticed that in order to ensure the accuracy of the IEC differential thermal model, the maximum Dt for temperature calculation should not exceed ½ of the minimum time constant of the thermal model.

The initialization can be done only once at the very beginning of the optimization, or at every time interval of the optimization if the top-oil and/or hot-spot temperature measurement is available.

Preferably, loading level should be corrected when only partial cooling capacity is put into operation for ONAF transformer. The correction equation is shown in (12), where K is the measured or the forecast loading level (load current/rated current), X is the cooling capacity, $S_0$ is the ratio of the transformer capacity in ONAN working condition to ONAF working condition, and $K_c$ is the corrected loading level.

$$K_c = \dfrac{K}{1-(1-X)(1-S_0)} \quad (12)$$

Section II

Method A: Use the Historical Optimal Cooling Capacities to Predict the Optimal Cooling Capacity Parameters for the Present Load Cycle As described above, the plots according to FIG. 3 provides a clue to use linking the optimal cooling capacity parameters for its previous load cycle and the difference between the optimal cooling capacity parameters of its previous load cycle and the one before the previous to predict the optimal cooling capacity parameters for the present load cycle, which can be calculated with the equation (13):

$$\begin{cases} C_{n\_N} = C_{n\_N-1} + \dfrac{m-n}{m}\Delta C \\ \Delta C = C_{m\_N-1} - C_{m\_N-2} \end{cases} \quad (13)$$

Where N is the number of present load cycle, n is the number of the time interval of the load cycle, m is the number of the last time interval of a load cycle, $C_{n\_N}$ is optimal cooling capacity parameter at time interval n of present load cycle N, $C_{n\_N-1}$ is optimal cooling capacity parameter at time interval n of previous load cycle N−1, $C_{m\_N-1}$ is optimal cooling capacity parameter at the last time interval m of previous load cycle N−1 (the second load cycle), $C_{m\_N-2}$ is optimal cooling capacity parameter at the last time interval m of the one before the previous load cycle N−2 (the first load cycle), ΔC is the difference of optimal cooling capacity parameter at the last time interval of the previous load cycle N−1 (the second load cycle) and that at the last time interval of the one before the previous N−2 (the first load cycle). By introducing ΔC, the variations of the optimal cooling capacity parameters between two successive load cycles are considered, instead of assuming they are the same. This allows the prediction algorithm to better fit the statistics of the history profile, and thus to be more accurate. The ways of defining the difference in method A are similar—simple minus for each time point (means ΔC is an m length vector), minus of random time point, minus of mean value, etc. Note that the equations would also change according to different definition, therefore the skilled person shall understand to switch the different definition before the introduction of equation (13).

In addition, more weight is put on the cooling capacity parameter difference in the computational correction related to the cooling capacity parameter at a first time interval than that at a second time interval of the present load cycle, where the first time interval is earlier than the second time interval. For example, the variation of ΔC will be gradually phased out by multiplying with coefficient (24−n)/24 with the increase of the number of the time interval n. Initially where n=1, the established cooling capacity parameter $C_{n\_N-1}$ at the last time interval of the second load cycle N−1 is corrected by 23/24*ΔC, and with n increasing to 24, the established cooling capacity parameter $C_{n\_N-1}$ at the last time interval of the second load cycle N−1 is corrected by zero. The reason of using the weight is that: $(C_{1\_N}-C_{1\_N-1})$ is similar to $(C_{m\_N-1}-C_{m\_N-2})$, because $C_{1\_N}$ is very close to $C_{m\_N-1}$. Therefore this similarity should be used to correct $C_{1\_N}$. But as time grows from t=1 to t=m, this similarity fades, and the value of $C_{n\_N-1}$ becomes stronger in impacting the value of $C_{n\_N}$. That's why we set the weight as it decreases with n grows.

Method A may apply to all of the time intervals of the present load cycle for calculation of their optimal cooling capacity parameters, where the series of the time intervals of the present load cycle are defined to occupy a whole range of the present load cycle.

As an alternative to method A, it is proposed method B.

Figure 4:
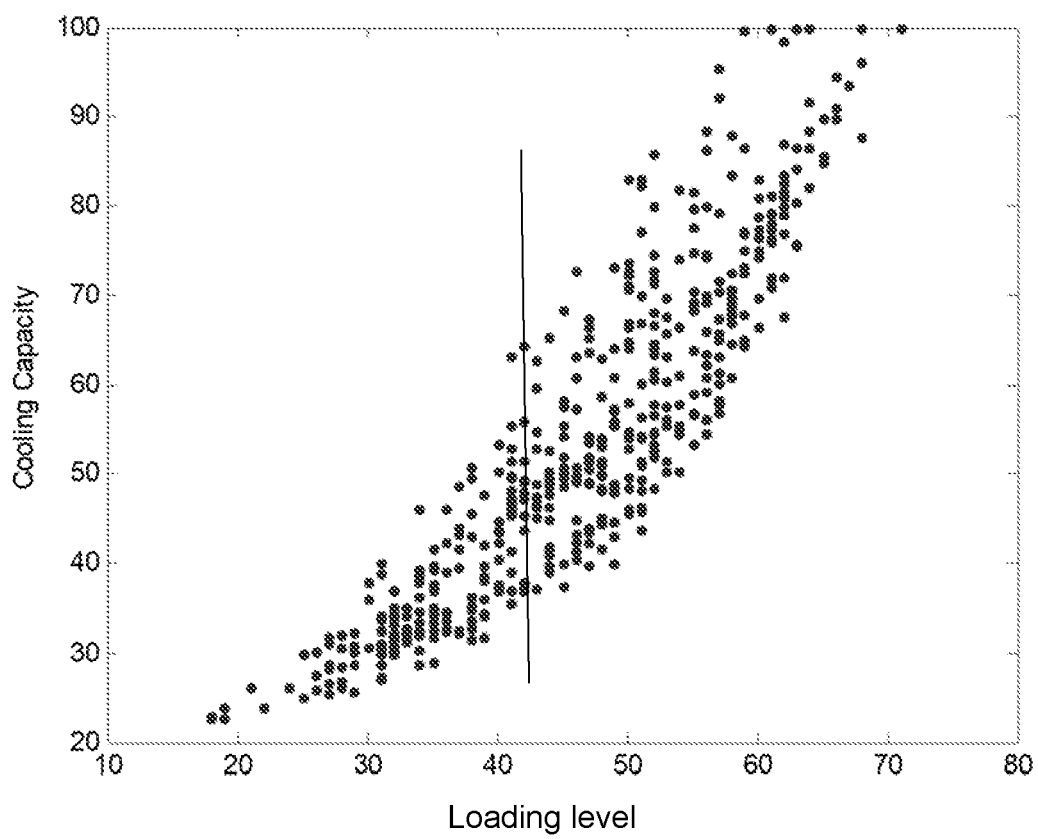
FIG. 4 shows statistical relationship between optimal cooling capacity parameters with loading level of the power equipment.

Method B: Use the Historical Optimal Cooling Capacities and Correlation Function between the Loading Level and the Optimal Cooling Capacity to Predict Optimal Cooling Capacity Parameters for Time Interval of the Present Load Cycle Curve fitting can be used in method B to find out the correlation function between the optimal cooling capacity parameters and the loading level. By using for example fourteen load cycles of historical data of loading level and ambient temperature, the optimal cooling capacity parameters can be calculated and its relationship with the loading level is shown in FIG. 4. It can be observed that in the light load period, the optimal cooling capacity parameters at the series of time intervals is somehow nonlinear to the load ratio; however in the heavy load period, as marked in the FIG. 4 when loading level reaches 45% and above, their relationship is quite linear.

In consideration of the statistical characteristics, method B can be used as complementary to method A for prediction of the optimal cooling capacity parameters at the series of time intervals of the present load cycle.

In particular, method A is applied to the series of the time intervals of the present load cycle are defined to partially occupy a range of the present load cycle where the operational condition related parameters at their counterparts in the history profile are within a predetermined range. For example, such range of the present load cycle covers the time intervals of the present load cycle at which the loading level is less than 45%.

For the rest of the series of the time intervals of the present load cycle where the operational condition related parameters at their counterparts in the history profile are outside of the predetermined range, for example the time intervals of the present load cycle at which the loading level is equal to or greater than 45%, the method B applies. For this purpose, it is established a seventh data set representing cooling capacity parameters for the cooling system at the rest of the series of time intervals of the present load cycle using an information of the operational condition related parameters and using a value of an coefficient, and the cooling system is controlled to operate at the rest of the series of time intervals of the present load cycle at the established cooling capacity parameters represented by the seventh data set.

By using the curve fitting method, we can obtain a simple equation to represent the relationship between loading level K and the optimal cooling capacity C for time intervals of present load cycle. Therefore, its computation time for optimization can reduced. The method B can adopt the algorithm according to equation (14):

$$C = 1.29K, K \geq 45\% \quad (14)$$

Where 1.29 is the curve fitting coefficient to represent the linear relationship between the loading level K and the optimal cooling capacity C in the given time window of fourteen load cycles. When the time window moves, this coefficient will change accordingly. Longer length of time window can provide better performance however at a cost of computation load.

In general, since in reality only the loading levels of the previous time intervals are known, the loading level of the previous time interval can be chosen to calculate the optimal cooling capacity parameter at time interval n of the present load cycle, as shown in (15).

$$C_{n\_N} = \text{coefficient} \times K_{n-1\_N}, K_{n-1\_N} \geq K_{set}\% \quad (15)$$

Where N is the number of present load cycle, n is the number of the time interval of the load cycle, $K_{n-1\_N}$ N is the loading level of the previous time interval n−1, and $K_{set}\%$ is the cutting point for the light load and the heavy load. The value of the coefficient can be obtained from the history profile indicating representing the linear relationship between the loading level and the optimal cooling capacity parameter.

With this relationship, a hybrid method can be therefore designed, the logic is as follows:

When the loading level of the previous time interval n−1 is lower than $K_{set}\%$, use equation (13) of method A to calculate the optimal cooling capacity parameter for present time interval n of present load cycle;

When the loading ratio of the previous time interval n−1 reaches $K_{set}\%$ and above, use equation (15) to calculate the optimal cooling capacity parameter for the present time interval n of present load cycle.

Section III

Method C: Use Historical Optimal Cooling Capacities, the Correlation Functions Between the Loading Level and the Optimal Cooling Capacity, and the Data Pattern of the Loading Ratio and Ambient Temperature to Predict the Optimal Cooling Capacity Parameter for a Series of Time Intervals of the Present Load Cycle Besides curve fitting, Pattern Recognition is also believed to be a practical method to find the relationship between optimal cooling capacity parameters and operational conditions related parameter, such as historical loading level K and ambient temperature T.

The working principle of pattern recognition is to find an operational condition related parameters at m time intervals prior to present time interval n in the historical data set which has the closest distance to the operational condition related parameters at the previous time interval n−m. When the closest historical vector is identified, then the optimal cooling capacity parameter at time interval n−m+1 will be determined as the optimal cooling capacity parameter for the present time interval n.

For this purpose, the method C including steps of:

(a) obtaining a eighth data set representing operational condition related parameters for the power equipment at a first series of time intervals of a plurality of load cycles in a history profile; for example, the eighth data set can be expressed by a vector as:

$$B = \begin{bmatrix} K_{n-1-i} & \text{Amb\_T}_{n-1-i} \\ K_{n-2-i} & \text{Amb\_T}_{n-2-i} \end{bmatrix}, i \geq 1$$

Where n is the number of present time interval of present load cycle, $K_{n-m}$ is the loading level at m time intervals before the present time interval n, and $\text{Amb\_T}_{n-m}$ is the ambient temperature at m time intervals before the present time interval n, and i varying above 1 denotes the first series of time intervals of a plurality of load cycles in the history profile. In this example, the vector is concerned with operational condition related parameters at two time intervals, and the skilled person shall understand that the vector can be set involving other number of time intervals, such as one time interval, three time intervals or more. The upper limit for the variable i depends on the length of the time window used for finding the closest pattern, namely the first series of time intervals of the plurality of load cycles in the history profile. For example, if 14 load cycle data are selected as the time window for pattern recognition, then the upper limit for variable i can be calculated as m×14−1=13*m, where m is the number of time intervals of a load cycle.

(b) obtaining a ninth data set representing operational condition related parameters for the power equipment at a second series of time intervals preceding present time interval of a present load cycle in the history profile; for example, the ninth data set can be expressed by a vector as:

$$A = \begin{bmatrix} K_{n-1} & \text{Amb\_T}_{n-1} \\ K_{n-2} & \text{Amb\_T}_{n-2} \end{bmatrix}$$

Where n is the number of present time interval of present load cycle, $K_{n-m}$ is the loading level at m time intervals before the present time interval n, and $\text{Amb\_T}_{n-m}$ is the ambient temperature at m time intervals before the present time interval n, m vary from 1 to 2 denotes the operational condition related parameters at the second series of time intervals.

(c) determining a third series among the first series of time intervals where the operational condition related parameters at the third series of time intervals are most close to those at the second series of time intervals; for example, by calculating the Euclidean distance between vector A and each of vectors B(i) for i≥1, it can identify the one of vectors B which is closest to vector A and then determine the optimal cooling capacity parameter for present time interval n of present load cycle. The equation is shown in (16), where the loading level and ambient temperature at the last two time intervals are compared with the historical data to calculate the distance.

$$\begin{cases} A = \begin{bmatrix} K_{n-1} & Amb\_T_{n-1} \\ K_{n-2} & Amb\_T_{n-2} \end{bmatrix}, B = \begin{bmatrix} K_{n-1-i} & Amb\_T_{n-1-i} \\ K_{n-2-i} & Amb\_T_{n-2-i} \end{bmatrix}, i \geq 1 \\ ED_K \sqrt{(K_{n-1} - K_{n-1-i})^2 + (K_{n-2} - K_{n-2-i})^2} \\ ED_T = \sqrt{(Amb\_T_{n-1} - Amb\_T_{n-1-i})^2 + (Amb\_T_{n-2} - Amb\_T_{n-2-i})^2} \\ Dist = (ED_k + ED_T)/2 \end{cases}$$ (16)

Vector B(j) with the minimum distance to matrix A will be selected, and the vector B(j) represents the operational condition related parameters at the third series of time intervals:

$$B = \begin{bmatrix} K_{n-1-j} & Amb\_T_{n-1-j} \\ K_{n-2-j} & Amb\_T_{n-2-j} \end{bmatrix}$$

(d) obtaining a tenth data set representing operational cost related parameters Powerloss, Lifeloss, NoiseReductionloss specific to the power equipment and its cooling system for a third of the plurality of load cycle occupying the third series of time intervals.

The operational cost related parameters for the third load cycle may be read from corresponding historical data recorded in a history profile, or as an alternative be calculated with use of operational condition related parameter respectively for the third load.

(e) in consideration of the parameters represented by the tenth data set Powerloss, Lifeloss, Noise, through knowledge-based predetermined numerical and/or logical linkages, establishing a eleventh data set representing cooling capacity parameters CoolingCapacityParameter for the cooling system at the series of time intervals of the third load cycle according to criteria for operational cost optimization of the power equipment and its cooling system. This step can be perform in a similar method as described in section I.

(f) at the present time interval n of the present load cycle, controlling the cooling system to operate at the cooling capacity parameter CoolingCapacityParameter established for the time interval following the third series of the time interval of the third load cycle.

The method C provides an alternative approach for optimization of the cooling capacity parameter for the present load cycle.

The skilled person shall understand that other type of distance can be used for replacement of Euclidean distance as above, such as Mahalanobis distance.

Below is described an exemplary system for controlling cooling system of a power equipment using data processing device. The system includes a data processing device, which works together with a memory unit. The data processing device is configured for executing the method according to any of the above methods.

The system further includes a measurement unit being adapted for measuring the operational condition related parameters for the power equipment, and a memory unit being adapted for storing the history profile.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for controlling a cooling system of a power equipment, comprising:

obtaining a first data set representing operational cost related parameters specific to the power equipment and its cooling system at a series of time intervals of a first load cycle in a history profile;

obtaining a second data set representing operational cost related parameters specific to the power equipment and its cooling system at a series of time intervals of a second load cycle in the history profile, where the second load cycle follows the first load cycle;

in consideration of the parameters represented by the first data set, through knowledge-based predetermined numerical and/or logical linkages, establishing a third data set representing optimal cooling capacity parameters for the cooling system at the series of time intervals of the first load cycle according to criteria for operational cost optimization of the power equipment;

in consideration of the parameters represented by the second data set, through knowledge-based predetermined numerical and/or logical linkages, establishing a fourth data set representing optimal cooling capacity parameters for the cooling system at the series of time intervals of the second load cycle according to criteria for operational cost optimization of the power equipment;

establishing a fifth data set representing a cooling capacity parameter difference between the established cooling capacity parameters concerning the first load cycle and the second load cycle;

establishing a sixth data set representing cooling capacity parameters for the cooling system at a series of time intervals of a present load cycle by computationally correcting the established cooling capacity parameter concerning the time intervals of the second cycle load with use of the cooling capacity parameter difference; and controlling the cooling system to operate at a series of time intervals of the present load cycle at the established cooling capacity parameters concerning the present load cycle represented by the sixth data set.

2. The method according to claim 1, wherein:

more weight is put on the cooling capacity parameter difference in the computational correction related to the cooling capacity parameter at a first time interval than that at a second time interval of the present load cycle, where the first time interval is earlier than the second time interval.

3. The method according to claim 1, wherein:
the cooling capacity parameter difference is calculated using the established cooling capacity parameter concerning a last time interval of the second load cycle and using a last time interval of the first load cycle.

4. The method according to claim 1, wherein:
the series of the time intervals of the present load cycle are defined to occupy a whole range of the present load cycle.

5. The method according to claim 1, wherein:
the series of the time intervals of the present load cycle are defined to partially occupy a range of the present load cycle where the operational condition related parameters at their counterparts in the history profile are within a predetermined range; and
the rest of the series of the time intervals of the present load cycle are defined wherein operational condition related parameters at their counterparts in the history profile are outside of the predetermined range;
the method further includes steps of:
establishing a seventh data set representing cooling capacity parameters for the cooling system at the rest of the series of time intervals of the present load cycle using an information of the operational condition related parameters and using a value of a coefficient; and
controlling the cooling system to operate at the rest of the series of time intervals of the present load cycle at the established cooling capacity parameters represented by the seventh data set.

6. The method according to claim 5, further including step of:
obtaining the value of the coefficient from the history profile.

7. The method according claim 1, further including steps of:
obtaining the first data set in consideration of operational condition related parameters for the power equipment for a series of time intervals of the first load cycle; and
obtaining the second data set in consideration of operational condition related parameters for the power equipment for a series of time intervals of the second load cycle.

8. The method according to claim 2, wherein:
the cooling capacity parameter difference is calculated using the established cooling capacity parameter concerning a last time interval of the second load cycle and using a last time interval of the first load cycle.

9. The method according to claim 2, wherein:
the series of the time intervals of the present load cycle are defined to occupy a whole range of the present load cycle.

10. The method according to claim 3, wherein:
the series of the time intervals of the present load cycle are defined to occupy a whole range of the present load cycle.

11. The method according to claim 2, wherein:
the series of the time intervals of the present load cycle are defined to partially occupy a range of the present load cycle where operational condition related parameters at their counterparts in the history profile are within a predetermined range; and
the rest of the series of the time intervals of the present load cycle are defined wherein the operational condition related parameters at their counterparts in the history profile are outside of the predetermined range;
the method further includes steps of:
establishing a seventh data set representing cooling capacity parameters for the cooling system at the rest of the series of time intervals of the present load cycle using an information of the operational condition related parameters and using a value of an coefficient; and
controlling the cooling system to operate at the rest of the series of time intervals of the present load cycle at the established cooling capacity parameters represented by the seventh data set.

12. The method according to claim 3, wherein:
the series of the time intervals of the present load cycle are defined to partially occupy a range of the present load cycle where operational condition related parameters at their counterparts in the history profile are within a predetermined range; and
the rest of the series of the time intervals of the present load cycle are defined wherein the operational condition related parameters at their counterparts in the history profile are outside of the predetermined range;
the method further includes steps of:
establishing a seventh data set representing cooling capacity parameters for the cooling system at the rest of the series of time intervals of the present load cycle using an information of the operational condition related parameters and using a value of an coefficient; and
controlling the cooling system to operate at the rest of the series of time intervals of the present load cycle at the established cooling capacity parameters represented by the seventh data set.

13. The method according to claim 2, further including steps of:
obtaining the first data set in consideration of operational condition related parameters for the power equipment for a series of time intervals of the first load cycle; and
obtaining the second data set in consideration of operational condition related parameters for the power equipment for a series of time intervals of the second load cycle.

14. The method according to claim 2, further including steps of:
obtaining the first data set in consideration of operational condition related parameters for the power equipment for a series of time intervals of the first load cycle; and
obtaining the second data set in consideration of operational condition related parameters for the power equipment for a series of time intervals of the second load cycle.

15. A method for controlling a cooling system of a power equipment, comprising:
obtaining a eighth data set representing operational condition related parameters for the power equipment at a first series of time intervals of a plurality of load cycles in a history profile;
obtaining an ninth data set representing operational condition related parameters for the power equipment at a second series of time intervals preceding present time interval of a present load cycle in the history profile;
determining a third series among the first series of time intervals where the operational condition related parameters at the third series of time intervals are most close to those at the second series of time intervals;

obtaining a tenth data set representing operational cost related parameters specific to the power equipment and its cooling system for a third of the plurality of load cycle occupying the third series of time intervals;

in consideration of the parameters represented by the tenth data set, through knowledge-based predetermined numerical and/or logical linkages, establishing a eleventh data set representing cooling capacity parameters for the cooling system at the series of time intervals of the third load cycle according to criteria for operational cost optimization of the power equipment and its cooling system; and at the present time interval of the present load cycle, controlling the cooling system to operate at the cooling capacity parameter established for the time interval following the third series of the time interval of the third load cycle.

16. The method according to claim 15, wherein:

the operational cost related parameters specific to the power equipment and its cooling system are concerned with power loss of them, the power equipment lifecycle cost and noise reduction cost for the cooling system; and an operational condition related parameter for the power equipment is concerned with ambient temperature and loading level.

17. The method according to claim 15, wherein:

the power equipment is a power transformer.

18. A system for controlling cooling system of a power equipment, comprising:

at least one data processing device, wherein the data processing device is configured to:

obtain a first data set representing operational cost related parameters specific to the power equipment and its cooling system at a series of time intervals of a first load cycle in a history profile;

obtain a second data set representing operational cost related parameters specific to the power equipment and its cooling system at a series of time intervals of a second load cycle in the history profile, where the second load cycle follows the first load cycle;

in consideration of the parameters represented by the first data set, through knowledge-based predetermined numerical and/or logical linkages, establish a third data set representing optimal cooling capacity parameters for the cooling system at the series of time intervals of the first load cycle according to criteria for operational cost optimization of the power equipment;

in consideration of the parameters represented by the second data set, through knowledge-based predetermined numerical and/or logical linkages, establish a fourth data set representing optimal cooling capacity parameters for the cooling system at the series of time intervals of the second load cycle according to criteria for operational cost optimization of the power equipment;

establish a fifth data set representing a cooling capacity parameter difference between the established cooling capacity parameters concerning the first load cycle and the second load cycle;

establish a sixth data set representing cooling capacity parameters for the cooling system at a series of time intervals of a present load cycle by computationally correcting the established cooling capacity parameter concerning the time intervals of the second cycle load with use of the cooling capacity parameter difference; and control the cooling system to operate at a series of time intervals of the present load cycle at the established cooling capacity parameters concerning the present load cycle represented by the sixth data set.

19. The system according to claim 18, further including:

a measurement unit, being adapted for measuring operational condition related parameters for the power equipment.

20. The system according to claim 18, further including:

a memory unit, being adapted for storing the history profile.

* * * * *